(12) United States Patent
Xie

(10) Patent No.: US 6,514,366 B1
(45) Date of Patent: Feb. 4, 2003

(54) METHOD OF DEVELOPING TREAD PATTERN

(75) Inventor: Ke-Jun Xie, Copley, OH (US)

(73) Assignee: Bridgestone/Firestone North American Tire, LLC, Nashville, TN (US)

(*) Notice: Subject to any disclaimer, the term of this patent is extended or adjusted under 35 U.S.C. 154(b) by 0 days.

(21) Appl. No.: 09/501,746

(22) Filed: Feb. 10, 2000

(51) Int. Cl.[7] .......... B29D 30/00; B29D 30/52; B60C 11/03; B60C 113/00

(52) U.S. Cl. .......... 156/110.1; 73/146; 152/209.2; 703/1; 703/8

(58) Field of Search .......... 156/110.1; 152/209.2, 152/209.3; 703/1, 6, 7, 8; 73/146

(56) References Cited

U.S. PATENT DOCUMENTS

| | | | |
|---|---|---|---|
| 3,682,221 A | * 8/1972 | Marzocchi et al. | |
| 4,327,792 A | * 5/1982 | Landers et al. | 152/209.2 |
| 4,598,748 A | 7/1986 | Campos et al. | 152/209 |
| 4,727,501 A | 2/1988 | Parker et al. | 364/574 |
| 4,788,651 A | 11/1988 | Parker et al. | 364/574 |
| 4,823,853 A | 4/1989 | Hitzky | 152/209 |
| 5,240,054 A | 8/1993 | Kogure | 152/209 |
| 5,295,087 A | 3/1994 | Yoshida et al. | 364/578 |
| 5,309,964 A | 5/1994 | Kogure | 152/209 |
| 5,371,685 A | 12/1994 | Bandel et al. | 364/505 |
| 5,383,506 A | 1/1995 | Kogure | 152/209 |
| 5,617,341 A | * 4/1997 | Nakajima | |
| 5,658,409 A | 8/1997 | Kakumo | 156/110.1 |
| 5,743,974 A | 4/1998 | Wesolowski | 152/209 |
| 5,753,057 A | 5/1998 | Wesolowski | 152/209 |
| 5,759,310 A | 6/1998 | Wesolowski | 152/209 |
| 5,759,312 A | 6/1998 | Wesolowski | 152/209 |
| 5,974,872 A | * 11/1999 | Morishita et al. | 152/209.2 |
| 5,996,660 A | * 12/1999 | Kakumu et al. | 152/209.2 |
| 6,112,167 A | * 8/2000 | Zakelj | |
| 6,192,745 B1 | * 2/2001 | Tang et al. | 73/146 |

FOREIGN PATENT DOCUMENTS

| | | | |
|---|---|---|---|
| EP | 323519 | * | 7/1989 |
| EP | 0464438 | | 6/1991 |
| EP | 0542493 | | 11/1992 |
| EP | 0536705 A2 | | 4/1993 |
| EP | 0645264 | | 9/1994 |
| EP | 0724972 | | 8/1995 |
| EP | 0928706 A2 | | 7/1999 |
| EP | 0928706 A3 | | 7/1999 |
| JP | 11-23357 | * | 1/1999 |
| JP | 2000141509 | | 5/2000 |
| WO | 98/25775 | | 6/1998 |

OTHER PUBLICATIONS

Abstract for Japan 2000–141509.*
VDI Berichte 779, pp. 179 and 189, Sep. 22, 1989.*
International Search Report, Application No.: PCT/US01/02648, Dated: May 28, 2001.

* cited by examiner

Primary Examiner—Steven D. Maki
(74) Attorney, Agent, or Firm—John M Vasuta; Michael Sand

(57) ABSTRACT

A method of designing a tread unit that may be repeated in succession about the circumference of a tire to produce an acoustically acceptable tread pattern. The impact of an initial design of a tread unit on a road surface is simulated so that a determination of the number of pulses contained in the impact may be made. An analysis is then performed, based on the number of pulses, as to whether the tread unit design satisfies a predetermined acoustic criteria. If the tread unit design satisfies the acoustic criteria, it may be incorporated into the tire tread pattern. Otherwise, the method may be repeated with a modified tread unit design until the predetermined acoustic criteria is satisfied.

15 Claims, 2 Drawing Sheets

METHOD OF DEVELOPING TREAD PATTERN

FIELD OF THE INVENTION

This invention relates generally to the art of tires and, more particularly, a method of designing a tire tread unit that, when incorporated in succession in a tread pattern, provides the tire with acoustically acceptable characteristics.

BACKGROUND AND SUMMARY OF THE INVENTION

The tread of conventional vehicle tires typically comprises a plurality of load bearing tire tread units separated by a network of grooves. The tread block units are repeated in succession about the circumference of the tire to produce the tread pattern. As the tire rolls over a road surface, the tread units move into and out of engagement with the road surface causing disturbances in the surrounding air molecules that generate sounds. For any given tread pattern, a certain amount of acoustic energy, or "tire noise" is produced.

During the design phases of a tread pattern, the ability of the tire tread to produce an acceptably low noise level at tread passage frequency is an important consideration. To this end, much effort has been directed to the reduction of objectionable tire noise with emphasis on redistributing the energy produced by the tire tread at tread passage frequency over a broad band frequencies. In the past, this has been accomplished by a technique of applying pitches of different lengths in such a way that energy distribution over the frequencies is as spread-out as possible. This arrangement of pitches of variable lengths is called "pitch sequence." In contrast, if tread units of constant pitch length are used, the sound generated is dominated by pure tones at tread passage frequency and its integer multiples.

Thus, in the past, the initial tread unit was designed to satisfy non-sound criteria such as, for example, wear-resistance, wet/dry traction and rolling resistance. During the creation of the tread pattern, a pitch sequence was then applied. Since pitch sequences were created independent of tread unit designs, the tread pattern produced then had to go through an iterative process of analytical evaluation and modification to obtain the best acoustic arrangement.

In a method of developing a tire tread pattern according to the present invention, the initial tread unit is designed to satisfy certain sound criteria. Specifically, if a tread unit design satisfies this criteria, it may be repeated in succession about the circumference of the tire to produce the tread pattern. The tread pattern produced mathematically eliminates the noise at tread passage frequency regardless of the pitch sequence used to produce the tread pattern. Analytical evaluation and modification of the tread pattern after its creation is not necessary.

More specifically, the present invention provides a method comprising the steps of importing a tread unit design geometry, simulating the impact of the tread unit design on a road surface, determining the number of pulses contained in the simulated impact, and analyzing, based on the number of pulses, whether the tread unit design satisfies a predetermined acoustic criteria. If a tread unit satisfies the acoustic criteria, it may be repeated in succession about the circumference of the tire to develop a tire tread pattern. Otherwise, the method may be repeated with a modified tread unit until the predetermined criteria is satisfied.

The step of simulating the impact of the tread unit design on the road surface may comprise the steps of digitizing the tread unit design, constructing a model using the digitized tread unit, and generating tread impact signals using the impact signa. The step of determining may comprise using Fast Fourier Transform (FFT) to determine the number of pulses contained in the simulated tread unit impact design. The predetermined criteria may comprise multiplying the number of pulse in the impact signal by the number of tread units in the tread pattern and determining whether this product is greater than a predetermined value, this value being, for example, 100.

The present invention provides these and other features hereinafter fully described and particularly pointed out in the claims. The following description and drawings set forth in detail certain illustrative embodiments of the invention. These embodiments are indicative, however, of but a few of the various ways in which the principles of the invention may be employed.

DRAWINGS

DETAILED DESCRIPTION

Figure 1:
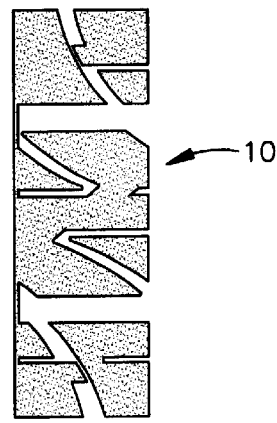
FIG. 1 is an illustration of a tread unit design for use in a method according to the present invention.
Figure 2:
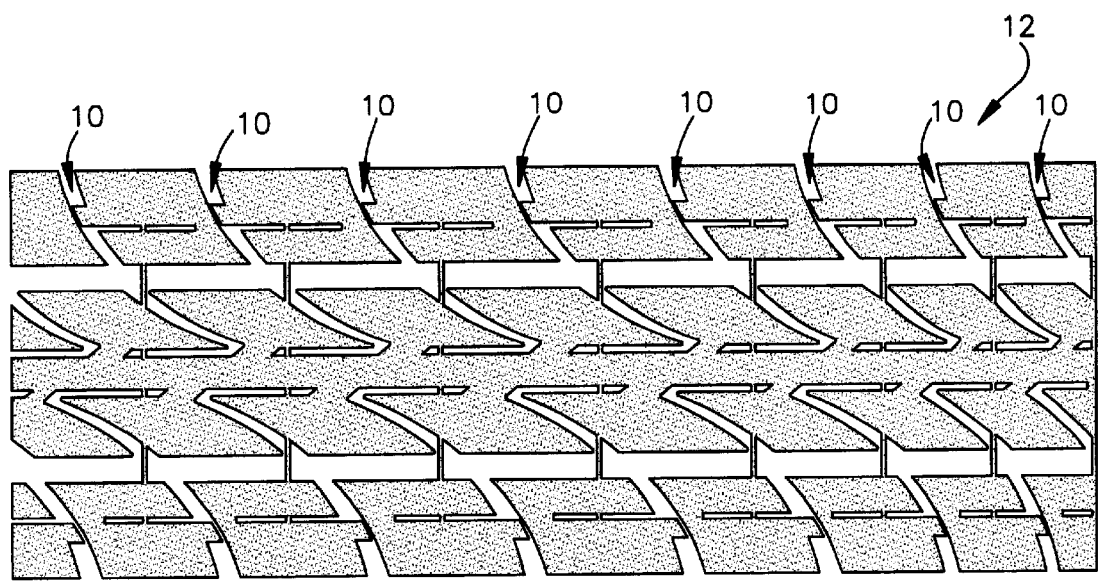
FIG. 2 is an illustration of a tread pattern in which a tread unit design, which satisfies certain sound criteria, is repeated in succession.

Referring now to the drawings, an initial design of a tread unit 10 is shown in FIG. 1. If the tread unit 10 satisfies certain sound criteria, it may be repeated in succession (in different pitches, for example) about the circumference of the tire to produce a tread pattern, such as the tread pattern 12 shown in FIG. 2. In any event, by evaluating acoustic characteristics of the initial tread unit 10, independent of the pitch sequence eventually used in the tread pattern 12, objectionable noise may be reduced.

In the method according to the present invention, the impact of the tread unit 10 on a road is simulated and the number of pulses contained in the simulated impact is determined. An analysis is then performed, based on the number of pulses, as to whether the tread unit 10 satisfies certain acoustic criteria. This analysis may comprise multiplying the number of pulses in the tread unit 10 by the number of tread units in the tread pattern 12 and determining whether this product is greater than a predetermined value. In the illustrated embodiment, the acoustic characteristics of the tread unit 10 are considered acceptable when this product is greater than 100.

If the tread unit 10 satisfies the predetermined acoustic criteria, it may be incorporated into the tread pattern 12. Otherwise, the method may be repeated on another design of a tread unit until a design is developed which satisfies the acoustic criteria.

Figure 3:
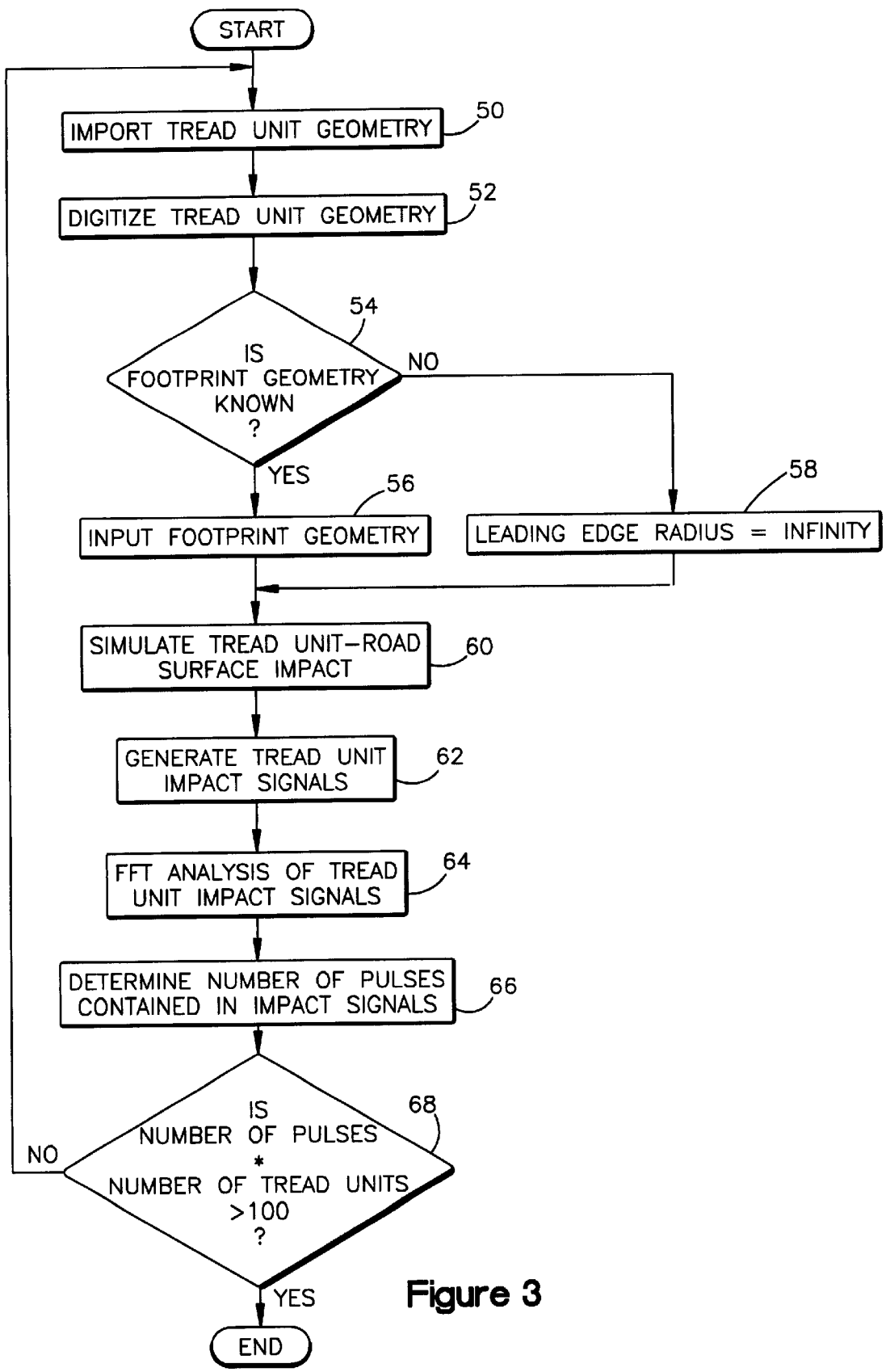
FIG. 3 is a flow chart representative of the method according to the present invention.

Referring now to FIG. 3, a flow chart representative of the method of the present invention is provided. As shown, a tread unit geometry is imported (block 50) and then digitized (block 52). The tread unit geometry may be digitized on a coordinate system so as to define the load-supporting portions of the tread which would contact with the road surface and distinguish them in binary form from those portions of the tread which would not contact the road surface. In other words, after digitization, the tread unit is represented by a matrix of "1's" and "0's" with the "1's" representing the load-supporting portions and the "0's" representing the grooves and slots.

If the footprint leading edge geometry of the tire is known (block 54), it is inputted (block 56). Otherwise, it is assumed to be radius of infinity (block 58). A model simulating the impact of the tread unit on a road surface is then constructed using the digitized tread unit and the footprint leading edge geometry (block 60). The impact model may be constructed by adding the "1's" and the "0's" along the leading edge at any given position in the circumferential direction. Tread unit impact signals are then generated by applying the impact model as the footprint leading edge moves from one end of the tread unit to the other end of the tread unit in the circumferential direction (block 62).

An FFT analysis is performed on the impact signals (block 64) to determine the number of pulses contained in the impact signals (block 66). If any of the first six harmonics in the transformed impact signals is at least twice larger than the largest preceding harmonics, the number of pulses contained in the impact signals is considered to be the number representing the harmonics. Otherwise, the number of pulses is one. If the number of pulses contained in the impact signal does not satisfy the predetermined acoustic criteria (block 66), the process is repeated.

Although the invention has been shown and described with respect to a certain embodiment, it is obvious that equivalent alterations and modifications will occur to others skilled in the art upon the reading and understanding of this specification. The present invention includes all such alterations and modifications and moreover is limited only by the scope of the following claims.

What is claimed:

1. A method of developing a tread pattern comprising the steps of:

importing a tread unit design;

simulating the impact of the tread unit design on a road surface;

determining the number of pulses contained in the simulated impact;

analyzing, based on the number of pulses, whether the tread unit design satisfies a predetermined acoustic criteria;

performing said importing, simulating and analyzing steps until an acoustically satisfactory tread unit design is identified which satisfies the predetermined acoustic criteria; and repeating in succession said acoustically-satisfactory tread unit design to develop the tread pattern.

2. A method as set forth in claim 1, wherein said analyzing step comprises multiplying the number of pulses by the expected number of tread units in the tread pattern and comparing this product to a predetermined value.

3. A method as set forth in claim 2, wherein said comparing step comprises verifying whether the product is greater than 100.

4. A method as set forth in claim 1, wherein said simulating step comprises digitizing the tread unit design, constructing an impact model using the digitized tread unit and footprint leading edge geometry, and generating tread unit impact signals from the impact model.

5. A method as set forth in claim 4, wherein said digitizing step comprises digitizing the tread unit design on a coordinate system so as to define load-supporting portions of the tread unit design which would contact with the pavement and distinguish them in binary form from those portions of the tread unit design which would not contact the pavement.

6. A method as set forth in claim 5, wherein said digitizing step comprises representing the digitized tread unit by a matrix of "1's" and "0's" with the "1's" representing the load-supporting portions and the "0's" representing grooves and slots in the tread unit design.

7. A method as set forth in claim 4, wherein the constructing step comprises providing a known footprint leading edge geometry.

8. A method as set forth in claim 4, wherein the constructing step comprises assuming that leading edge radius of the footprint is infinity.

9. A method as set forth in claim 4, wherein said constructing step comprises adding the "1's" and "0's" along the footprint leading edge at any given position in the circumferential direction.

10. A method as set forth in claim 4, wherein said generating step comprises generating the impact signals by applying the impact model as the footprint leading edge moves from one end of the tread unit to the other end of the tread unit in the circumferential direction.

11. A method as set forth in claim 1, wherein said determining step comprises performing a Fast Fourier Transform analysis on the impact signals generated by the impact model.

12. A method as set forth in claim 1, wherein said determining step comprises determining whether any of the first six harmonics in the transformed impact signals is at least twice larger than the largest preceding harmonics.

13. A method as set forth in claim 1, wherein said determining step comprises assuming the number of pulses in the impact signals being the number representing the harmonics which is at least twice larger than the largest preceding harmonics.

14. A method as set forth in claim 1, wherein said determining step comprises assuming the number of pulses in the impact signals is one.

15. A method as set forth in claim 1 wherein said repeating step comprises repeating the tread unit design in a plurality of pitches.

* * * * *